United States Patent
Tsai

(10) Patent No.: US 10,534,029 B1
(45) Date of Patent: Jan. 14, 2020

(54) POWER CONVERSION APPARATUS

(71) Applicant: Chicony Power Technology Co., Ltd., New Taipei (TW)

(72) Inventor: Hsien-Yi Tsai, New Taipei (TW)

(73) Assignee: CHICONY POWER TECHNOLOGY CO., LTD., New Taipei (TW)

( * ) Notice: Subject to any disclaimer, the term of this patent is extended or adjusted under 35 U.S.C. 154(b) by 0 days.

(21) Appl. No.: 16/276,052

(22) Filed: Feb. 14, 2019

(30) Foreign Application Priority Data

Dec. 7, 2018 (TW) .............................. 107144243 A

(51) Int. Cl.
*H02M 3/335* (2006.01)
*G01R 31/02* (2006.01)
*G01R 31/40* (2014.01)
*G01R 27/26* (2006.01)
*H02M 1/42* (2007.01)

(52) U.S. Cl.
CPC ....... *G01R 31/028* (2013.01); *G01R 27/2605* (2013.01); *G01R 31/40* (2013.01); *H02M 1/4225* (2013.01); *H02M 3/33569* (2013.01)

(58) Field of Classification Search
CPC .. G01R 31/028; G01R 31/40; G01R 27/2605; H02M 1/4225; H02M 3/33569
See application file for complete search history.

(56) References Cited

U.S. PATENT DOCUMENTS

| | | | | |
|---|---|---|---|---|
| 6,944,034 B1 * | 9/2005 | Shteynberg | ......... | H02M 1/4258 323/282 |
| 10,224,802 B1 * | 3/2019 | Chakkirala | ............ | H02M 1/08 |
| 2010/0045301 A1 | 2/2010 | Savary et al. | | |
| 2010/0246220 A1 * | 9/2010 | Irving | ................. | H02M 1/4225 363/78 |
| 2013/0300310 A1 * | 11/2013 | Hu | ..................... | H05B 33/0854 315/239 |

(Continued)

FOREIGN PATENT DOCUMENTS

| CN | 201836268 U | 5/2011 |
|---|---|---|
| CN | 102375093 A | 3/2012 |

(Continued)

*Primary Examiner* — Adolf D Berhane
*Assistant Examiner* — Kevin H Sprenger
(74) *Attorney, Agent, or Firm* — Innovation Capital Law Group, LLP; Vic Lin

(57) ABSTRACT

A power conversion apparatus includes a primary-side circuit, a bulk capacitor, a conversion circuit, and a master control circuit. The primary-side circuit is adapted to rectify and boost an alternating-current power and output primary-side output. The bulk capacitor is connected in parallel to two output ends of the primary-side output. The conversion circuit is configured to receive the primary-side output passing through the bulk capacitor and convert the primary-side output into secondary-side output. The master control circuit detects an electric power state of the alternating-current power, obtains a time interval, a power of the secondary-side output corresponding to the time interval, and two of the capacitor voltages corresponding to the start and the end of the time interval when the electric power state is power-off, and selectively outputs an abnormal signal according to the time interval, the power, the capacitor voltages, and a threshold.

14 Claims, 4 Drawing Sheets

(56) References Cited

U.S. PATENT DOCUMENTS

| | | | |
|---|---|---|---|
| 2015/0333633 A1* | 11/2015 | Chen | H02M 1/42 363/21.17 |
| 2016/0181931 A1* | 6/2016 | Song | H02M 1/15 363/21.15 |
| 2016/0356837 A1 | 12/2016 | Nakao et al. | |
| 2017/0336463 A1 | 11/2017 | Makdessi et al. | |

FOREIGN PATENT DOCUMENTS

| | | |
|---|---|---|
| CN | 102684583 A | 9/2012 |
| CN | 105527501 A | 4/2016 |
| CN | 107561346 A | 1/2018 |
| TW | 434990 B | 5/2001 |
| TW | I323347 B | 4/2010 |
| TW | 201319580 A | 5/2013 |
| TW | 201616097 A | 5/2016 |
| TW | I598922 B | 9/2017 |

\* cited by examiner

POWER CONVERSION APPARATUS

CROSS-REFERENCE TO RELATED APPLICATION

This non-provisional application claims priority under 35 U.S.C. § 119(a) to Patent Application No. 107144243 filed in Taiwan, R.O.C. on Dec. 7, 2018, the entire contents of which are hereby incorporated by reference.

BACKGROUND

Technical Field

The present disclosure relates to a power conversion apparatus, and particularly, to a power conversion apparatus having a bulk capacitor.

Related Art

An alternating current-to-direct current power converter is configured to convert an alternating current (AC) into a direct current (DC). In consideration of the volume, the weight, and the conversion efficiency, most of power converters of mobile apparatuses are switch-type power converters. Most of the power converters include a primary-side circuit and a conversion circuit. The primary-side circuit is usually equipped with a bulk capacitor, configured to smooth an output voltage of the primary-side circuit. A working state of the bulk capacitor affects operational efficiency of the whole power converter. When the bulk capacitor ages as a number of times of charging and discharging accumulates, the bulk capacitor affects efficiency of the power converter. Secondly, if the bulk capacitor works in a poor working environment (for example, at a high temperature or high humidity) for a long time, its service life is shortened, and efficiency of the power converter is also degraded early correspondingly.

SUMMARY

In view of this, the present disclosure provides a power conversion apparatus, to detect a current working state of a bulk capacitor.

In some embodiments, a power conversion apparatus includes a primary-side circuit, a bulk capacitor, a conversion circuit, and a master control circuit. The primary-side circuit has two output ends, where the primary-side circuit is adapted to rectify and boost an AC power and output a primary-side output from the two output ends. The bulk capacitor is connected in parallel to the two output ends. The conversion circuit is configured to receive the primary-side output passing through the bulk capacitor and convert the primary-side output into a secondary-side output. The master control circuit is configured to detect an electric power state of the AC power and a capacitor voltage of the bulk capacitor, and configured to obtain, when the electric power state is power-off, a time interval, a power of the secondary-side output corresponding to the time interval, and two of the capacitor voltages corresponding to the start and the end of the time interval, and selectively output an abnormal signal according to the time interval, the power, the capacitor voltages, and a threshold.

In some embodiments, the threshold is a capacitance threshold, the master control circuit obtains a current nominal capacitance value of the bulk capacitor according to the time interval, the power, and the capacitor voltages, the master control circuit outputs the abnormal signal when the current nominal capacitance value is less than the capacitance threshold, and the master control circuit does not output the abnormal signal when the current nominal capacitance value is not less than the capacitance threshold.

In some embodiments, the current nominal capacitance value is obtained according to the following formula:

$$\frac{1}{2} \cdot C \cdot [V_1^2 - V_2^2] = P \cdot t,$$

where C is the current nominal capacitance value, t is the time interval, V1 is the first capacitor voltage corresponding to the start of the time interval, V2 is the second capacitor voltage corresponding to the end of the time interval, and P is the power.

In some embodiments, the master control circuit comprises a primary control circuit and a secondary control circuit. The primary control circuit is configured to detect the electric power state of the AC power and the capacitor voltage of the bulk capacitor. The secondary control circuit is configured to obtain the time interval, the power of the secondary-side output corresponding to the time interval, and the two capacitor voltages corresponding to the start and the end of the time interval when the electric power state is power-off. The secondary control circuit is configured to selectively output the abnormal signal according to the time interval, the power, the capacitor voltages, and the threshold.

In some embodiments, the power conversion apparatus comprises an isolation circuit, connecting the primary control circuit and the secondary control circuit.

In some embodiments, the primary-side circuit comprises a rectification circuit and a power factor correction circuit. The rectification circuit is configured to rectify the AC power to output a rectified electric power. The power factor correction circuit boosts the rectified electric power and outputs the primary-side output.

In some embodiments, the conversion circuit comprises a transformer circuit and a secondary-side circuit. The transformer circuit is configured to receive the primary-side output passing through the bulk capacitor and convert the primary-side output into a converted output. The secondary-side circuit receives the converted output and outputs the secondary-side output. The transformer circuit is a resonant circuit.

In some embodiments, the threshold is a time threshold. The master control circuit obtains the time interval when the two capacitor voltages are substantially equal to a first voltage value and a second voltage value, respectively. The master control circuit outputs the abnormal signal when the time interval is less than the time threshold, and the master control circuit does not output the abnormal signal when the time interval is not less than the time threshold.

In some embodiments, a power conversion apparatus includes a primary-side circuit, a bulk capacitor, a conversion circuit, and a master control circuit. The primary-side circuit has two output ends. The primary-side circuit is adapted to rectify and boost an AC power and output a primary-side output from the two output ends. The bulk capacitor is connected in parallel to the two output ends. The conversion circuit is configured to receive the primary-side output passing through the bulk capacitor and convert the primary-side output into a secondary-side output. The master control circuit is configured to detect an electric power state of the AC power, and obtain, at the end of a time interval after the electric power state is power-off, a capacitor voltage of the bulk capacitor, The master control circuit outputs an abnormal signal when the obtained capacitor voltage is less than a voltage threshold.

In some embodiments, the master control circuit comprises a primary control circuit and a secondary control circuit. The primary control circuit detects the electric power state. The primary control circuit obtains, at the end of the time interval after the electric power state is power-off, the capacitor voltage. The primary control circuit outputs the abnormal signal when the capacitor voltage is less than the voltage threshold.

In some embodiments, the power conversion apparatus comprises an isolation circuit connecting the primary control circuit with the secondary control circuit.

In some embodiments, a power conversion apparatus includes a primary-side circuit, a bulk capacitor, a conversion circuit, and a master control circuit. The primary-side circuit has two output ends. The primary-side circuit is adapted to rectify and boost an AC power and output primary-side output from the two output ends. The bulk capacitor is connected in parallel to the two output ends. The conversion circuit is configured to receive the primary-side output passing through the bulk capacitor and convert the primary-side output into a secondary-side output. The master control circuit is configured to detect an electric power state of the AC power. The master is configured to obtain a power of the secondary-side output within a time interval after the electric power state is power-off. The master control circuit outputs an abnormal signal when the power is less than a power threshold.

In some embodiments, the master control circuit comprises a primary control circuit and a secondary control circuit. The primary control circuit detects the electric power state and notifies the secondary control circuit when the electric power state is power-off. The secondary control circuit obtains the power of the secondary-side output within the time interval after receiving the power-off notification. The secondary control circuit outputs the abnormal signal when the obtained power is less than the power threshold.

According to some embodiments, the power conversion apparatus may be applied to a power conversion technology having a bulk capacitor and determine whether the bulk capacitor is abnormal at the time being.

DETAILED DESCRIPTION

Figure 1:
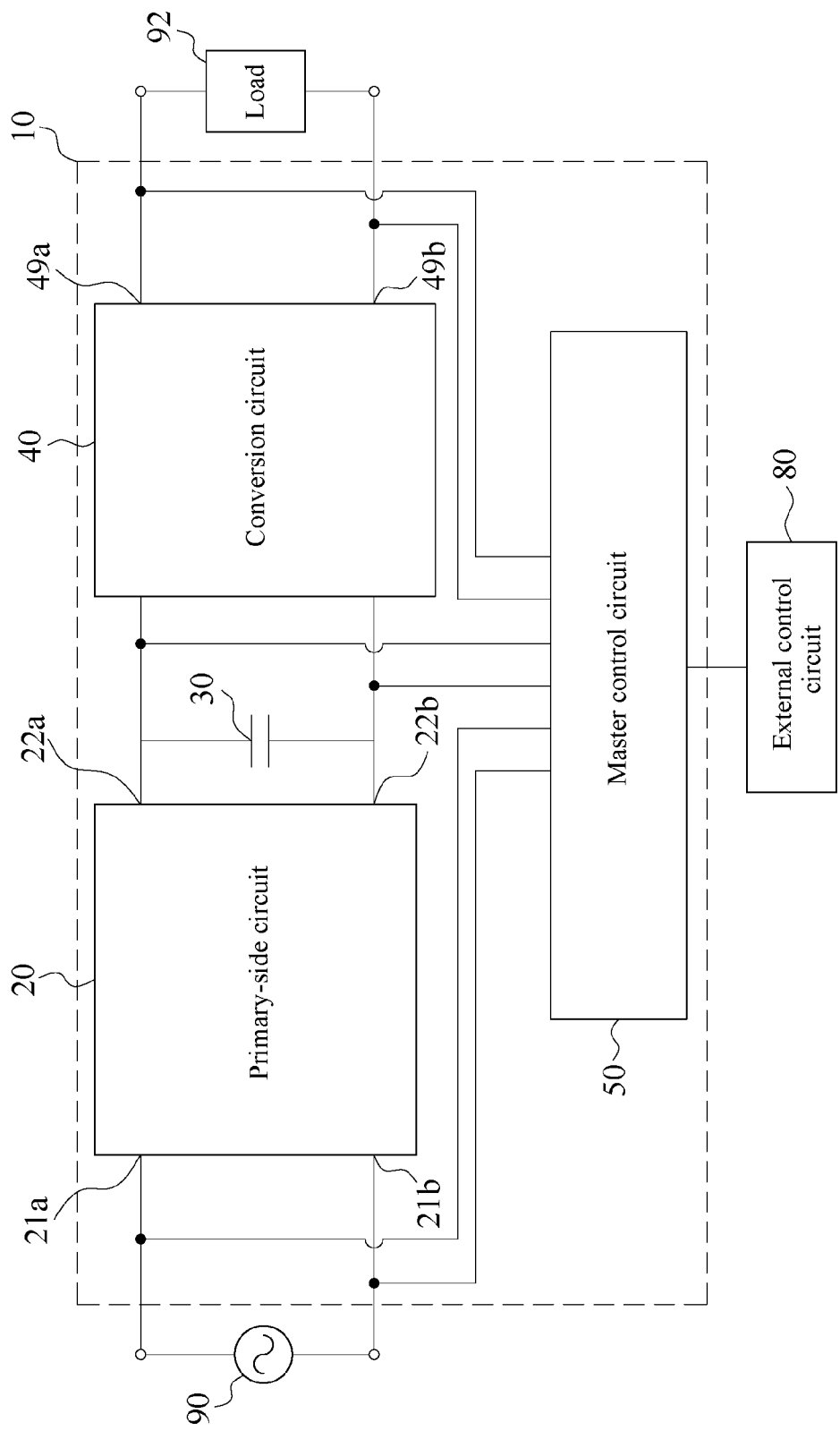
FIG. 1 illustrates a schematic block diagram of a circuit of a power conversion apparatus according to some embodiments.

FIG. 1 is a block diagram of a circuit of a power conversion apparatus according to some embodiments of the present disclosure. A power conversion apparatus 10 is configured to convert an alternating-current (AC) power output by an AC power supplier 90 into a direct current power, and output the direct current power to a load 92.

The foregoing AC power supplier 90 may be, but is not limited to, a mains grid. The foregoing load 92 may be, but is not limited to, any load such as an electronic apparatus, a mobile phone, a tablet computer, a computer, a desktop computer, or a notebook computer.

In the embodiment of FIG. 1, the power conversion apparatus 10 includes a primary-side circuit 20, a bulk capacitor 30, a conversion circuit 40, and a master control circuit 50.

The primary-side circuit 20 has two output ends 22a and 22b. The primary-side circuit 20 is adapted to rectify and boost an AC power and output primary-side output from the two output ends 22a and 22b. The bulk capacitor 30 is connected in parallel to the two output ends 22a and 22b, and configured to smooth a voltage of the primary-side output.

The conversion circuit 40 is configured to receive the primary-side output passing through the bulk capacitor 30 and convert the primary-side output into secondary-side output. The master control circuit 50 is configured to detect an electric power state of the AC power and a capacitor voltage of the bulk capacitor 30. The master control circuit 50 is configured to obtain a time interval, a power of the secondary-side output corresponding to the time interval, and two of the capacitor voltages corresponding to the start and the end of the time interval when the electric power state is power-off, and selectively output an abnormal signal according to the time interval, the power, the capacitor voltages, and a threshold.

During operation, the primary-side circuit 20 rectifies and boosts the AC power and outputs rectified and boosted electric power (that is, the foregoing primary-side output). The bulk capacitor 30 smoothes the primary-side output and outputs smoothed electric power. The master control circuit 50 controls the conversion circuit 40 to make the smoothed electric power converted by the conversion circuit 40, the secondary-side output is output on a secondary side (a right side in FIG. 1) of the conversion circuit, and the secondary-side output is connected to the load 92.

In some embodiments, the electric power state of the AC power detected by the foregoing master control circuit 50 may be power-off or power-on. The time interval may be a time interval calculated from the start of the foregoing power-off, may be a default value, or may be a characteristic parameter that can be compared with the foregoing threshold to determine whether the capacitor is abnormal. Details are provided below.

In some embodiments, the foregoing power is a power of the secondary-side output of the conversion circuit 40. Specifically, when the power conversion apparatus 10 is connected to the load 92, the power output by the power conversion apparatus 10 on the conversion circuit 40 in response to the load 92 is the power of the secondary-side output. The master control circuit 50 measures a voltage value and a current value of the secondary-side output, and multiplies the voltage value by the current value, so as to obtain the power of the foregoing secondary-side output. The power may be calculated with reference to the following formula I:

$$P(t1) = I(t1) \times V(t1) \quad \text{(formula I)},$$

where t1 is a time, I(t1) is a current value at a time point t1, V(t1) is a voltage value at the time point t1, and P(t1) is a power at the time point t1.

The foregoing threshold is a threshold used to determine whether operation of the bulk capacitor 30 is normal. In some embodiments, the threshold may be a capacitance threshold, a voltage threshold, a power threshold, or a time threshold, and is separately described below.

Embodiment I for Determining if Abnormal (in a Fixed Time Interval, Determining Whether the Bulk Capacitor is Abnormal According to a Current Nominal Capacitance)

In some embodiments, the power conversion apparatus 10 determines whether the bulk capacitor 30 is abnormal according to a current nominal capacitance in a fixed time interval. The threshold of this embodiment is a capacitance threshold Cth. The capacitance threshold Cth may be 50% to 80% of an initial nominal capacitance value of a normal bulk capacitor 30. If the capacitance threshold Cth is set to be higher, the master control circuit 50 is more sensitive in determining whether the bulk capacitor 30 is abnormal. To be specific, in an early aging stage of the bulk capacitor 30, the master control circuit 50 sends the abnormal signal. On the contrary, if the capacitance threshold Cth is set to be lower, the master control circuit 50 sends the abnormal signal when the bulk capacitor 30 ages to a significant degree.

The foregoing nominal capacitance value is a value of a symbol C calculated according to the time interval, the power of the secondary-side output, the two capacitor voltages, and the following formula II:

$$\frac{1}{2} \cdot C \cdot [V_1^2 - V_2^2] = P \cdot t. \quad \text{(formula II)}$$

C is the nominal capacitance value. t is a time length (corresponding to the foregoing time interval). V1 is a first capacitor voltage measured on two ends of the bulk capacitor 30 at the start of power-off. V2 is a second capacitor voltage measured on the two ends of the bulk capacitor 30 after the time period t since the power-off. In other words, V1 is the capacitor voltage corresponding to the start of the time period (time interval) t while V2 is the capacitor voltage corresponding to the end of the time period t. P is a power of the foregoing secondary-side output. According to the definition to the formula II in the electronics, the power is an output power of the capacitance C. However, in the present disclosure, the capacitance output power P in the formula II is changed to the power of the secondary-side output. Therefore, in the present disclosure, the calculated capacitance value is referred to as a "nominal capacitance value".

The foregoing initial nominal capacitance value is a nominal capacitance value calculated by substituting the power of the secondary-side output, the first capacitor voltage, and the second capacitor voltage that are measured by the master control circuit 50 in a predetermined time interval t into the formula II when the AC power is cut off during initial and normal use of the bulk capacitor 30.

During implementation, the foregoing time interval t may be determined with reference to a holdup time of the bulk capacitor 30. For example, when the holdup time of the normal bulk capacitor 30 in the power conversion apparatus 10 is 16 milliseconds (ms), the time interval t may be set to be less than the holdup time, which, for example, is, but is not limited to, 6 ms, 8 ms, 10 ms, or 12 ms. For example, the time interval t is set to 6 ms and the bulk capacitor 30 is normal. The master control circuit 50 calculates a current nominal capacitance value of the bulk capacitor 30 after 6 ms since power-off according to the formula II. The current nominal capacitance value is an initial nominal capacitance value of the bulk capacitor 30 (a nominal capacitance value during initial use of the normal bulk capacitor). If the power conversion apparatus 10 attempts to consider that the bulk capacitor 30 is abnormal when the current nominal capacitance value is reduced to 70% of the initial nominal capacitance value, the capacitance threshold Cth is set to 70% of the initial nominal capacitance value.

Subsequently, an example in which the capacitance threshold Cth is set to 50% of the initial nominal capacitance value is used for description. The capacitance threshold Cth is stored in a memory of the power conversion apparatus 10 in advance. During implementation, the power conversion apparatus 10 normally operates, and when the AC power supplier 90 is cut off (that is, does not supply an AC power to the primary-side circuit 20), the master control circuit 50 obtains, by detecting an AC power of two input ends 21a and 21b of the primary-side circuit 20, that the electric power state is "power-off". In addition, the master control circuit 50 measures the first capacitor voltage (V1) of the bulk capacitor 30 (determined to be the first capacitor voltage at the beginning of power-off). When determining that the electric power state is power-off, the master control circuit 50 starts to calculate a power of the secondary-side output. The master control circuit 50 measures, at the end of the time interval t, the second capacitor voltage (V2) of the bulk capacitor 30, ends the calculation of the power of the secondary-side output, and obtains an average power P of the secondary-side output (the average power is the foregoing "output power"). Subsequently, the master control circuit 50 substitutes the time interval t, the average power P of the secondary-side output, the first capacitor voltage (V1), and the second capacitor voltage (V2) into the foregoing formula II, to obtain the current nominal capacitance value of the bulk capacitor 30.

The master control circuit 50 compares the current nominal capacitance value with the capacitance threshold Cth. When the current nominal capacitance value is less than the capacitance threshold Cth, indicating that the current nominal capacitance value of the bulk capacitor 30 is lower than 50% of the initial nominal capacitance value, the power conversion apparatus 10 considers that the bulk capacitor 30 is abnormal. Therefore, the master control circuit 50 sends the abnormal signal.

In addition to being determined by means of a test, the foregoing capacitance threshold may alternatively be determined by estimation according to a characteristic parameter of the normal bulk capacitor 30 and conversion efficiency of the power conversion apparatus 10.

In conclusion, in this embodiment in which the power conversion apparatus 10 determines whether the bulk capacitor 30 is abnormal according to the current nominal capacitance value in the fixed time interval t, when the AC power supplier 90 is abruptly cut off, the master control circuit 50 measures the first capacitor voltage (V1) and the second capacitor voltage (V2) at a start and an end of the fixed time interval t, measures and calculates the average power P of the secondary-side output, and substitutes the first capacitor voltage (V1), the second capacitor voltage (V2), and the average power P into the formula II, to obtain the current nominal capacitance value, and sends the abnormal signal when the current nominal capacitance value is less than the capacitance threshold.

The abnormal signal sent by the master control circuit 50 may be output to an external control circuit 80, and communication between the master control circuit 50 and the external control circuit 80 may use, but not limited to, the digital power control protocol (also referred to as Power Management Bus, PMBus).

With regard to that the master control circuit 50 determines the electric power state of the AC power, in some embodiments, the master control circuit 50 may directly read the AC power and determine whether the AC power exists (power-off), for example, by using an integrated circuit (IC) having such a function. In some embodiments, the master control circuit 50 uses a differential comparator for determining, and the master control circuit 50 determines whether the AC power is cut off by determining output of the differential comparator.

Embodiment II for Determining if Abnormal (in a Fixed Time Interval, Determining Whether the Bulk Capacitor is Abnormal According to a Second Capacitor Voltage)

In some embodiments, the power conversion apparatus 10 determines whether the bulk capacitor 30 is abnormal according to a second capacitor voltage in a fixed time interval. The threshold of this embodiment is a voltage threshold Vth. The voltage threshold Vth may be 70% to 90% of the second capacitor voltage of the normal bulk capacitor 30. The normal second capacitor voltage is a current voltage of the normal bulk capacitor 30 measured by master control circuit 50 after a predetermined time interval t since the AC power is cut off. If the voltage threshold Vth is set to be higher, the power conversion apparatus 10 is more sensitive in determining whether the bulk capacitor 30 is abnormal. To be specific, in an early aging stage of the bulk capacitor 30, the power conversion apparatus 10 sends the abnormal signal. On the contrary, if the voltage threshold Vth is set to be lower, the power conversion apparatus 10 sends the abnormal signal when the bulk capacitor 30 ages to a significant degree.

During implementation, the foregoing time interval t may be determined with reference to a holdup time of the bulk capacitor 30. The time interval t may be, but is not limited to, ½, ⅓, ¼, ⅗, or ⅘ of the holdup time.

Subsequently, an example in which the voltage threshold Vth is 80% of the normal current voltage value (the second capacitor voltage) of the normal bulk capacitor 30 measured by the master control circuit 50 after the time interval t since the AC power is cut off is used for description. The voltage threshold Vth is stored in a memory of the power conversion apparatus 10 in advance. During implementation, the power conversion apparatus 10 normally operates, and when the AC power supplier 90 is cut off, the master control circuit 50 obtains that the electric power state is "power-off". The master control circuit 50 measures, at the end of the time interval t, the second capacitor voltage (V2) of the bulk capacitor 30, and compares the second capacitor voltage (V2) with the voltage threshold Vth, and if the second capacitor voltage (V2) is less than the voltage threshold Vth, the master control circuit 50 sends the abnormal signal.

Embodiment III for Determining if Abnormal (in a Fixed Time Interval, Determining Whether the Bulk Capacitor is Abnormal According to an Average Power of Secondary-Side Output)

In some embodiments, the power conversion apparatus 10 determines whether the bulk capacitor 30 is abnormal according to an average power of the secondary-side output within a fixed time interval. The threshold of this embodiment is a power threshold Pth. The power threshold Pth may be 50% to 80% of the average power of the secondary-side output of the power conversion apparatus 10 that has the normal bulk capacitor 30 and that cooperates with the load 92 (a rated load of the power conversion apparatus 10 may be used) in a time interval t since a start of cut-off of the AC power. If the power threshold Pth is set to be higher, the power conversion apparatus 10 is more sensitive in determining whether the bulk capacitor 30 is abnormal. To be specific, in an early aging stage of the bulk capacitor 30, the power conversion apparatus 10 sends the abnormal signal. On the contrary, if the power threshold Pth is set to be lower, the power conversion apparatus 10 sends the abnormal signal when the bulk capacitor 30 ages to a significant degree.

During implementation, the power threshold Pth is stored in a memory of the power conversion apparatus 10 in advance. When the AC power supplier 90 is cut off, the master control circuit 50 obtains that the electric power state is "power-off", starts to calculate a power of the secondary-side output, and calculates a current average power by summation at the end of the time interval t. The master control circuit 50 subsequently compares the current average power with the power threshold. The master control circuit 50 sends the abnormal signal when the current average power is less than the power threshold Pth.

Embodiment IV for Determining if Abnormal (Determining Whether the Bulk Capacitor is Abnormal According to an Elapsed Time)

In some embodiments, the power conversion apparatus 10 determines whether the bulk capacitor 30 is abnormal according to an elapsed time. The threshold of this embodiment is a time threshold Tth. The time threshold Tth may be a predetermined percentage of a time period (hereinafter referred to as an elapsed time) between the start of cut-off of the AC power to the time point that the second capacitor voltage V2 is reduced to a predetermined voltage value when the power conversion apparatus 10 with the normal bulk capacitor 30 provides the load 92 with electrical power. The predetermined percentage may range from 50% to 80%. If the time threshold Tth is set to be higher, the power conversion apparatus 10 is more sensitive in determining whether the bulk capacitor 30 is abnormal. To be specific, in an early aging stage of the bulk capacitor 30, the power conversion apparatus 10 sends the abnormal signal. On the contrary, if the time threshold Tth is set to be lower, the power conversion apparatus 10 sends the abnormal signal when the bulk capacitor 30 ages to a significant degree.

During implementation, the time threshold Tth is stored in a memory of the power conversion apparatus 10 in advance. When the AC power supplier 90 is cut off, the master control circuit 50 obtains an elapsed time calculated between the time point the electric power state is "power-off" and the time point the second capacitor voltage reaches the predetermined voltage value. Subsequently, the master control circuit 50 compares the elapsed time with the time threshold Tth. The master control circuit 50 sends the abnormal signal when the elapsed time is less than the time threshold Tth. In this embodiment, the bulk capacitor 30 has a first voltage value when the AC power supplier is cut off. The predetermined voltage value is a second voltage value.

Another implementation may alternatively be used to determine whether the bulk capacitor 30 is abnormal according to the elapsed time. In some embodiments, the master control circuit 50 monitors an electric power state of the AC power, and starts to calculate the elapsed time when the electric power state is power-off. When detecting that the electric power state of the secondary-side output is power-off, the master control circuit 50 stops the calculation of the elapsed time. Subsequently, the master control circuit 50 compares the elapsed time with the time threshold Tth, and sends the abnormal signal when the elapsed time is less than the time threshold Tth. The time threshold Tth in these embodiments needs to be additionally set to a predetermined percentage of a normal elapsed time of the normal bulk capacitor 30 from cut-off of the AC power to cut-off of the secondary-side output. This time threshold Tth is not the same as the foregoing time threshold Tth which is determined based on the predetermined voltage value. The foregoing implementation for determining whether the secondary-side output is cut off may be determined by whether a voltage of the secondary-side output is reduced to a predetermined proportion.

Subsequently, power conversion technologies in different types to which the power conversion apparatus 10 of the present disclosure is applicable and their operation are described. The power conversion apparatus 10 of the present disclosure is applicable to a power conversion technology having a conversion circuit 40 and a bulk capacitor 30 on a primary-side circuit 20, where the conversion circuit 40 includes a transformer circuit and a secondary-side circuit (details are provided below). The transformer circuit is configured to receive the primary-side output passing through the bulk capacitor 30 and convert the primary-side output into converted output, and the secondary-side circuit receives the converted output and outputs the secondary-side output. The transformer circuit may be a resonant circuit or a non-resonant circuit. The non-resonant circuit may be a flyback circuit (Flyback Converters) shown in FIG. 2 or a forward circuit (Forward Converters) shown in FIG. 3. The resonant circuit may be an LLC resonant circuit (LLC Resonant Converters) shown in FIG. 4. The present disclosure is only described by using applications in FIG. 2, FIG. 3, and FIG. 4. However, the application field of the present disclosure is not limited to these three transformer circuits (power conversion technologies).

Figure 2:
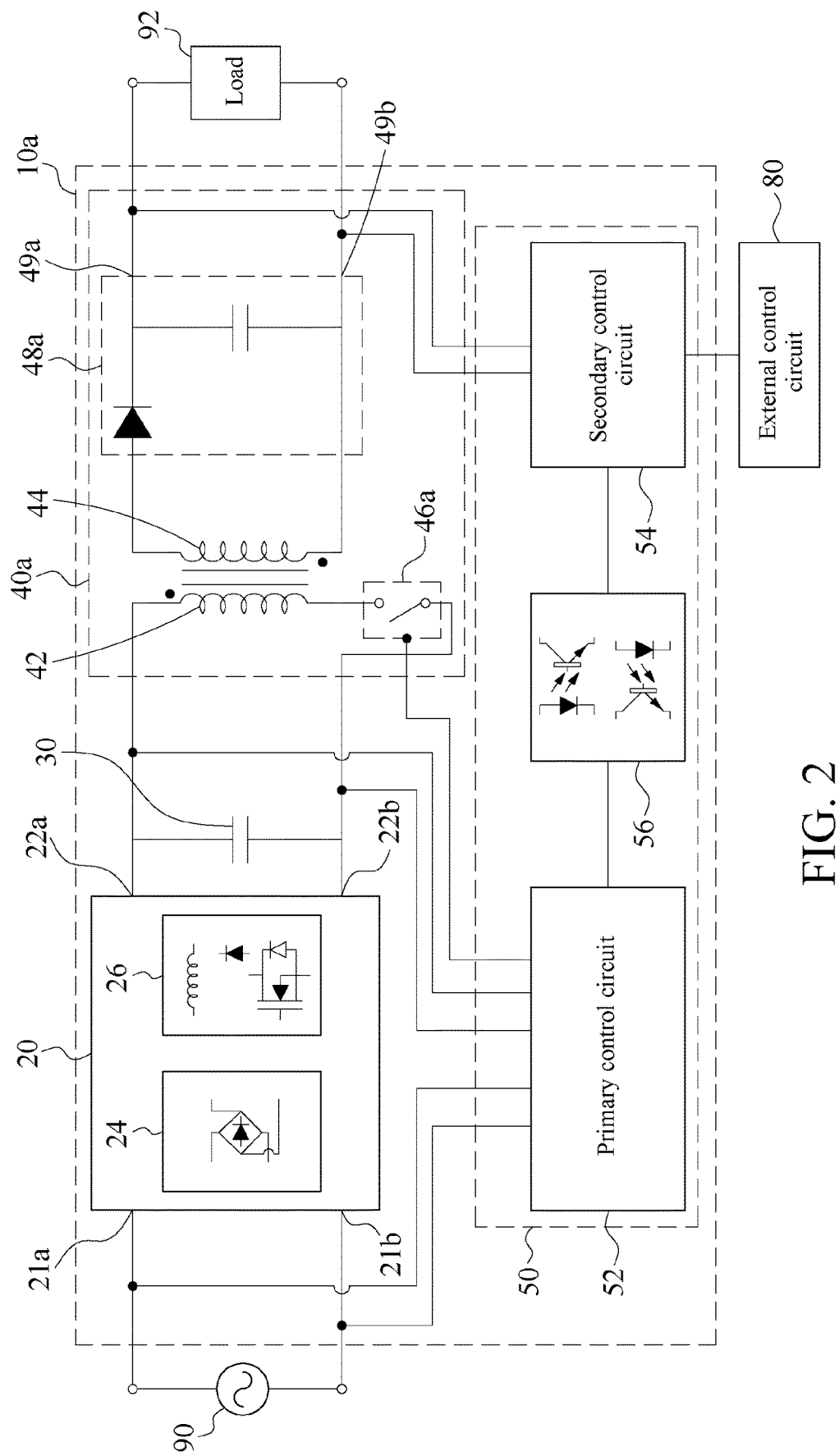
FIG. 2 illustrates a schematic block diagram of a circuit of a power conversion apparatus according to some embodiments.

FIG. 2 is a schematic block diagram of a circuit of a power conversion apparatus 10a according to some embodiments. The power conversion apparatus 10a includes a primary-side circuit 20, a bulk capacitor 30, a conversion circuit 40a, and a master control circuit 50.

The primary-side circuit 20 includes a rectification circuit 24 and a power factor correction circuit 26. The rectification circuit 24 is configured to rectify the AC power and output the rectified electric power. The power factor correction circuit 26 boosts the rectified electric power and outputs boosted electric power. The boosted electric power is the foregoing primary-side output. An embodiment of the rectification circuit 24 may be a bridge rectifier circuit shown in FIG. 2, but the rectification circuit 24 is not limited thereto. The rectification circuit 24 may alternatively be another circuit that rectifies the AC power. The power factor correction circuit 26 may be a power factor correction circuit 26 (as shown in FIG. 2) including an inductor, a switch, and a diode, but is not limited thereto.

Subsequently, the bulk capacitor 30 connected in parallel to the two output ends 22a and 22b smoothes a voltage of the primary-side output. Therefore, electric power received by the conversion circuit 40a is the primary-side output passing through the bulk capacitor 30 (that is, the rectified and boosted electric power passing through the bulk capacitor 30 parallelly connected with the two output ends 22a, 22b).

In some embodiments, the conversion circuit 40a includes a primary-side winding 42, a secondary-side winding 44, a coil switch 46a, and a secondary-side circuit 48a. The primary-side winding 42 receives the primary-side output passing through the bulk capacitor 30. The primary-side winding 42 is connected in series to the coil switch 46a. The master control circuit 50 controls on and off of the coil switch 46a, so that a current passing through the primary-side winding 42 is electric power at a predetermined frequency. Therefore, the secondary-side winding 44 generates converted output in response to the electric power at the predetermined frequency flowing through the primary-side winding 42, the converted output is transferred to the secondary-side circuit 48a, and the secondary-side circuit 48a rectifies and/or boosts the converted output, and then outputs the secondary-side output and provides the secondary-side output to the load 92. The secondary-side circuit 48a shown in FIG. 2 is a common secondary-side circuit, and details of its operation are not described again. The application of the present disclosure is not limited to the secondary-side circuit 48a of FIG. 2.

The foregoing coil switch 46a may be, but is not limited to, a bipolar junction transistor (BJT), a metal-oxide-semiconductor field-effect transistor (MOSFET), or an insulated gate bipolar transistor (IGBT).

The foregoing manner in which the master control circuit 50 detects cut-off of the AC power may be directly detecting a voltage of the AC power, and determining that the AC power has been cut off when the voltage value is lower than a predetermined proportion of a normal voltage value. The predetermined proportion may be, but is not limited to, 50% or 60%. The foregoing manner in which the master control circuit 50 detects whether the secondary-side output has been cut off may alternatively be directly detecting a direct current voltage value of the secondary-side output (on output ends 49a and 49b of the secondary-side circuit 48a), and determining that the secondary-side output has been cut off when the direct current voltage value is lower than a predetermined proportion of a normal value. The predetermined proportion may be, but is not limited to, 85%, 90%, or 95%.

Figure 4:
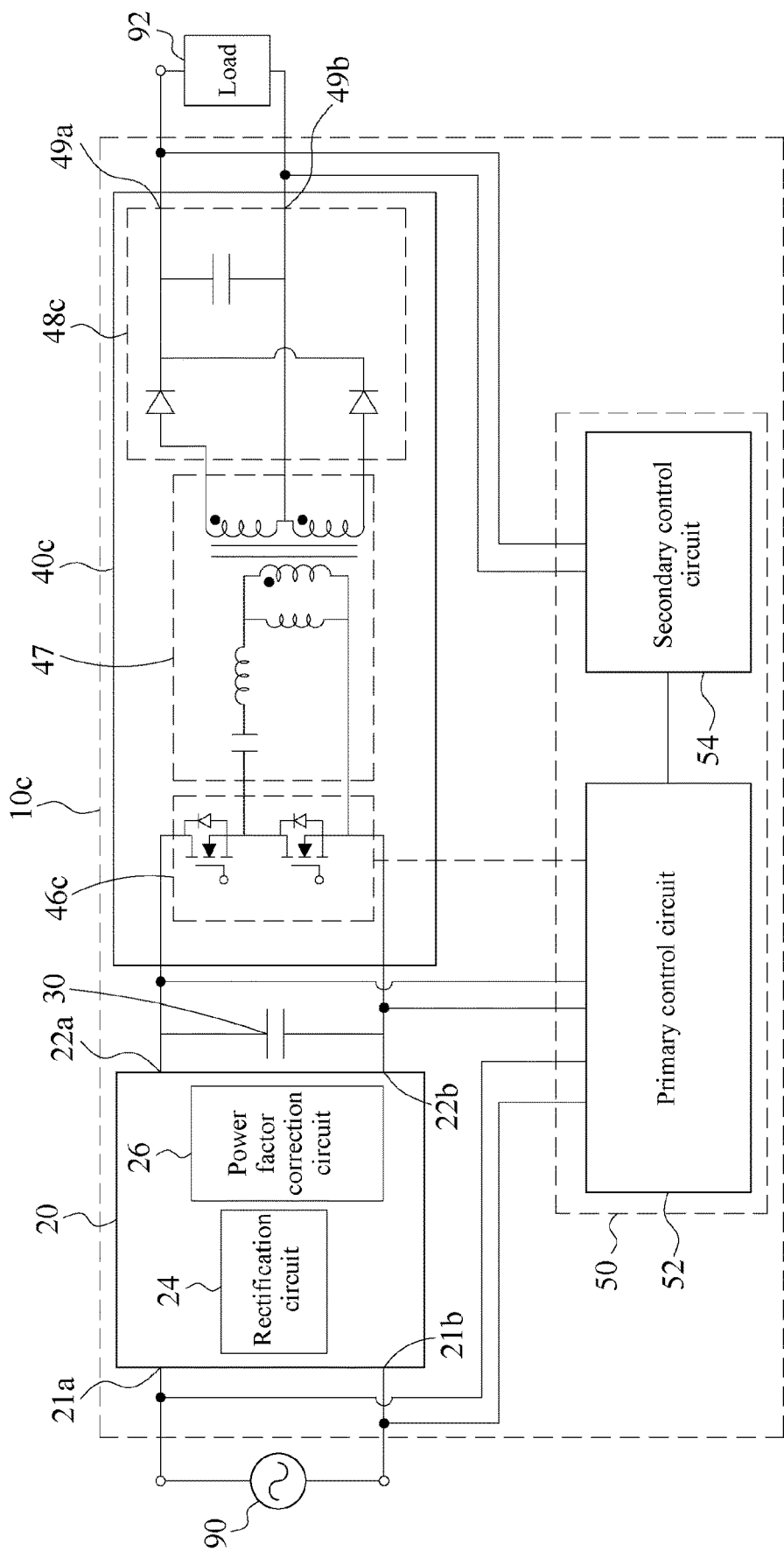
FIG. 4 illustrates a schematic block diagram of a circuit of a power conversion apparatus according to some embodiments.

According to some embodiments, the master control circuit 50 includes a primary control circuit 52 and a secondary control circuit 54. Actions of the master control circuit 50 are executed some by the primary control circuit 52 and others by the secondary control circuit 54. For example, but not limited to, the primary control circuit 52 is configured to detect the electric power state of the AC power and the capacitor voltage of the bulk capacitor 30, and the secondary control circuit 54 is configured to obtain the time interval t, the power of the secondary-side output corresponding to the time interval t, and the two capacitor voltages corresponding to the start and the end of the time interval t when the electric power state is power-off, and selectively output the abnormal signal according to the time interval t, the power, the capacitor voltages, and the threshold. In the embodiment of FIG. 2, the primary control circuit 52 and the secondary control circuit 54 are connected to and communicate with each other through an isolation circuit 56. However, an isolation circuit 56 does not need to be provided between the primary control circuit 52 and the secondary control circuit 54, and as shown in the embodiment of FIG. 4, the primary control circuit 52 and the secondary control circuit 54 may be directly electrically connected to or communicate with each other.

Specifically, the "Embodiment I for determining if abnormal" is used as an example. The primary control circuit 52 obtains, by detecting an AC power of two input ends 21a and 21b of the primary-side circuit 20, that the electric power state is "power-off". The primary control circuit 52 transfers the electric power state of power-off to the secondary control circuit 54, and meanwhile, the primary control circuit 52 measures the first capacitor voltage (V1) of the bulk capacitor 30. When receiving the electric power state of power-off, the secondary control circuit 54 starts to calculate a power of the secondary-side output. The primary control circuit 52 measures, at the end of the time interval t, the second capacitor voltage (V2) of the bulk capacitor 30 and sends the second capacitor voltage (V2) (a signal representing value of the second capacitor voltage) to the secondary control circuit 54. The secondary control circuit 54 also ends the calculation of the power of the secondary-side output at the end of the time interval t, to obtain an average power P of the secondary-side output. Subsequently, the secondary control circuit 54 substitutes the time interval t, the average power P of the secondary-side output, the first capacitor voltage (V1), and the second capacitor voltage (V2) into the foregoing formula II to obtain the current nominal capacitance value of the bulk capacitor 30. In some embodiments, the foregoing action of calculating the current nominal capacitance value may alternatively be performed by the primary control circuit 52. Relevant data may be transmitted by using an isolation element 56 between the primary control circuit 52 and the secondary control circuit 54. The relevant data may include, for example, but is not limited to, the time interval t, the average power P of the secondary-side output, the first capacitor voltage (V1), and the second capacitor voltage (V2).

In some embodiments, communication between the primary control circuit 52 and the secondary control circuit 54 may be performed by using an isolation element 56. The isolation element 56 may be, but is not limited to, an optical coupler. A communication manner between the primary control circuit 52 and the secondary control circuit 54 may be, but is not limited to, the foregoing digital power control protocol. By means of the foregoing communication, the primary control circuit 52 and the secondary control circuit 54 may exchange the power P of the secondary-side output, the first capacitor voltage V1, and the second capacitor voltage V2 that are measured.

According to the foregoing "Embodiment II for determining if abnormal", during implementation, the power conversion apparatus 10a normally operates, and when the AC power supplier 90 is cut off, the primary control circuit 52 obtains that the electric power state is "power-off". The primary control circuit 52 measures, at the end of the time interval t, the second capacitor voltage (V2) of the bulk capacitor 30, and compares the second capacitor voltage (V2) with the voltage threshold Vth, and if the second capacitor voltage (V2) is less than the voltage threshold Vth, the primary control circuit 52 sends the abnormal signal. In some embodiments, the primary control circuit 52 transfers the second capacitor voltage (V2) to the secondary control circuit 54, the secondary control circuit 54 compares the second capacitor voltage (V2) with the voltage threshold Vth, and if the second capacitor voltage (V2) is less than the voltage threshold Vth, the secondary control circuit 54 sends the abnormal signal.

According to the foregoing "Embodiment III for determining if abnormal", during implementation, the power threshold Pth is stored in a memory of the power conversion apparatus 10a in advance. The primary control circuit 52 detects the electric power state and notifies the secondary control circuit 54 when the electric power state is power-off, and the secondary control circuit 54 obtains the power of the secondary-side output within the time interval after receiving the power-off notification. The secondary control circuit 54 outputs the abnormal signal when the power is less than the power threshold. Specifically, when the AC power supplier 90 is cut off, the primary control circuit 52 notifies the secondary control circuit 54 when obtaining that the electric power state is "power-off", and the secondary control circuit 54 starts to calculate the power of the secondary-side output, and obtains a current average power by summation at the end of the time interval t. The secondary control circuit 54 subsequently compares the current average power with the power threshold. The secondary control circuit 54 sends the abnormal signal when the current average power is less than the power threshold Pth.

According to a first aspect of the foregoing "Embodiment IV for determining if abnormal", during implementation, the time threshold Tth is stored in a memory of the power conversion apparatus 10a in advance. When the AC power supplier 90 is cut off, the primary control circuit 52 starts to calculate an elapsed time since the electric power state is "power-off", and when the second capacitor voltage reaches the predetermined voltage value, stops the calculation of the elapsed time. Subsequently, the primary control circuit 52 compares the elapsed time with the time threshold Tth. The primary control circuit 52 sends the abnormal signal when the elapsed time is less than the time threshold Tth.

According to a second aspect of the foregoing "Embodiment IV for determining if abnormal", the primary control circuit 52 monitors an electric power state of the AC power, and starts to calculate the elapsed time when the electric power state is power-off. When the secondary control circuit 54 detects that an electric power state of the secondary-side output is power-off, the secondary control circuit 54 instructs the primary control circuit 52 to stop the calculation of the elapsed time. Subsequently, the primary control circuit 52 or the secondary control circuit 54 compares the elapsed time with the time threshold Tth, and sends the abnormal signal when the elapsed time is less than the time threshold Tth.

The foregoing four manners of determining whether the bulk capacitor 30 is abnormal: (1) the threshold is a capacitance threshold Cth, (2) the threshold is a voltage threshold Vth, (3) the threshold is a power threshold Pth, and (4) the threshold is a time threshold Tth, may alternatively be obtained by means of aging tests in a designing stage. Specifically, an aging test is performed on a predetermined load by using the power conversion apparatus 10. In a process of the aging test, when it is determined that bulk capacitor 30 has been aged, the threshold can be obtained according to the foregoing manners, and be written into the power conversion apparatus 10, so that during an operation process of the power conversion apparatus 10, when the AC power is cut off, the power conversion apparatus 10 can determine whether the bulk capacitor 30 has been aged, and sends an abnormal signal when the bulk capacitor 30 is abnormal. In some embodiments, the foregoing aging test may be cooperated with a statistical analysis method to predict a service life of the bulk capacitor 30 and write a corresponding threshold into the power conversion apparatus 10, to determine whether the bulk capacitor 30 is abnormal.

Figure 3:
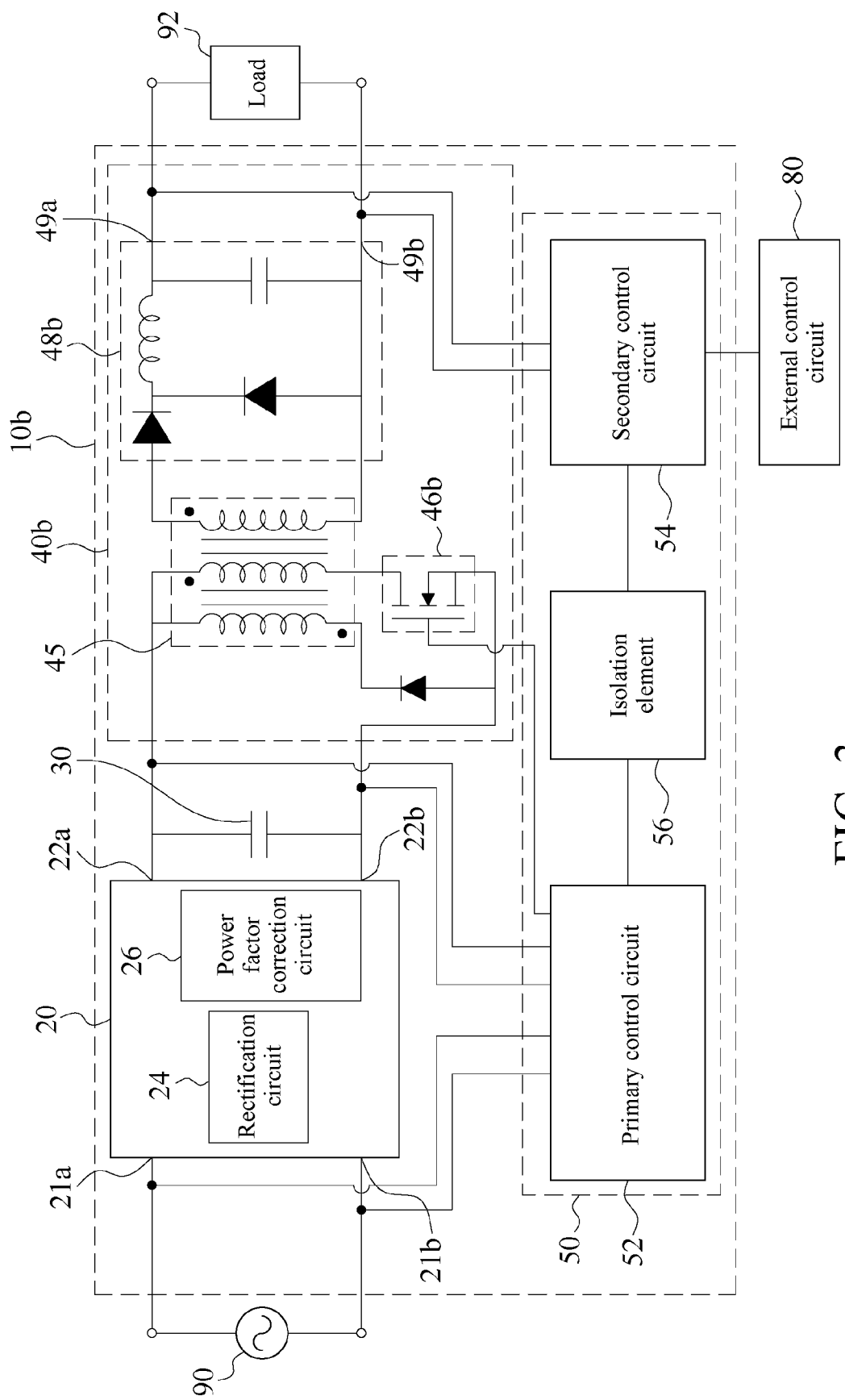
FIG. 3 illustrates a schematic block diagram of a circuit of a power conversion apparatus according to some embodiments.

Referring to FIG. 3, a power conversion apparatus 10b includes a primary-side circuit 20, a bulk capacitor 30, a conversion circuit 40b, and a master control circuit 50.

The primary-side circuit 20 has two output ends 22a and 22b. The primary-side circuit 20 is adapted to rectify and boost the foregoing AC power and output rectified and boosted electric power (that is, the foregoing primary-side output) from the two output ends 22a and 22b. The bulk capacitor 30 is connected in parallel to the two output ends 22a and 22b, and configured to smooth a voltage of the primary-side output.

The conversion circuit 40b is configured to receive the primary-side output passing through the bulk capacitor 30 and convert the primary-side output into secondary-side output. The conversion circuit 40b includes a forward winding 45, a coil switch 46b, and a secondary-side circuit 48b. The master control circuit 50 controls the coil switch 46b, so that an output end of the forward winding 45 generates converted electric power (or referred to as converted output). After the converted electric power passes through the secondary-side circuit 48b, the secondary-side output is output from the output ends 49a and 49b to the load 92.

The action of the master control circuit 50 may be the same as that of at least one of the foregoing embodiments for determining if abnormal. Details are not described again.

Referring to FIG. 4, a power conversion apparatus 10c includes a primary-side circuit 20, a bulk capacitor 30, a conversion circuit 40c, and a master control circuit 50.

The primary-side circuit 20 is adapted to rectify and boost the foregoing AC power and output primary-side output from the two output ends 22a and 22b. The bulk capacitor 30 is connected in parallel to the two output ends 22a and 22b, and configured to smooth a voltage of the primary-side output.

The conversion circuit 40c is configured to receive the primary-side output passing through the bulk capacitor 30 and convert the primary-side output into secondary-side output. The conversion circuit 40c includes an LLC winding 47, a switch group 46c, and a secondary-side circuit 48c. The master control circuit 50 controls the switch group 46c to enable an output end of the LLC winding 47 to generate converted electric power. After the converted electric power passes through the secondary-side circuit 48c, the secondary-side output is output from the output ends 49a and 49b to the load 92.

The action of the master control circuit 50 may be the same as that of at least one of the foregoing embodiments for determining if abnormal. Details are not described again. Secondly, as stated above, the master control circuit 50 includes a primary control circuit 52 and a secondary control circuit 54. The primary control circuit 52 and the secondary control circuit 54 are directly electrically connected to each other. Cooperative operation between the primary control circuit 52 and the secondary control circuit 54 are similar to previous embodiments. Details are not described again.

It could be learned from FIG. 1 to FIG. 4 that the power conversion apparatuses 10, 10a, 10b, and 10c of the present disclosure are applicable to a power conversion technology having the bulk capacitor 30, and the primary-side circuit 20, the conversion circuit 40, the master control circuit 50, and the like can all be adjusted according to the to-be-applied-to power conversion technology.

Although the present invention has been described in considerable detail with reference to certain preferred embodiments thereof, the disclosure is not for limiting the scope of the invention. Persons having ordinary skill in the art may make various modifications and changes without departing from the scope and spirit of the invention. Therefore, the scope of the appended claims should not be limited to the description of the preferred embodiments described above.

What is claimed is:

1. A power conversion apparatus, comprising:
a primary-side circuit, having two output ends, wherein the primary-side circuit is adapted to rectify and boost an alternating-current (AC) power and output a primary-side output from the two output ends;
a bulk capacitor, connected in parallel to the two output ends;
a conversion circuit, configured to receive the primary-side output passing through the bulk capacitor and convert the primary-side output into a secondary-side output; and
a master control circuit, configured to detect an electric power state of the AC power and a capacitor voltage of the bulk capacitor, and configured to obtain, when the electric power state is power-off, a time interval, a power of the secondary-side output corresponding to the time interval, and two of the capacitor voltages corresponding to a start and an end of the time interval, and selectively output an abnormal signal according to the time interval, the power, the capacitor voltages, and a threshold;
wherein the master control circuit comprises a primary control circuit and a secondary control circuit, the primary control circuit is configured to detect the electric power state of the AC power and the capacitor voltage of the bulk capacitor, and the secondary control circuit is configured to obtain the time interval, the power of the secondary-side output corresponding to the time interval, and the two capacitor voltages corresponding to the start and the end of the time interval when the electric power state is power-off, and selectively output the abnormal signal according to the time interval, the power, the capacitor voltages, and the threshold.

2. The power conversion apparatus according to claim 1, wherein the threshold is a capacitance threshold, the master control circuit obtains a current nominal capacitance value of the bulk capacitor according to the time interval, the power, and the capacitor voltages, the master control circuit outputs the abnormal signal when the current nominal capacitance value is less than the capacitance threshold, and the master control circuit does not output the abnormal signal when the current nominal capacitance value is not less than the capacitance threshold.

3. The power conversion apparatus according to claim 2, wherein the current nominal capacitance value is obtained according to the following formula:

$$\frac{1}{2} \cdot C \cdot [V_1^2 - V_2^2] = P \cdot t$$

wherein C is the current nominal capacitance value, t is the time interval, V1 is a first capacitor voltage corresponding to the start of the time interval, V2 is a second capacitor voltage corresponding to the end of the time interval, and P is the power.

4. The power conversion apparatus according to claim 1, further comprising an isolation circuit, connecting the primary control circuit and the secondary control circuit.

5. The power conversion apparatus according to claim 4, wherein the primary-side circuit comprises a rectification circuit and a power factor correction circuit, the rectification circuit is configured to rectify the AC power to output a rectified electric power, and the power factor correction circuit boosts the rectified electric power and outputs the primary-side output.

6. The power conversion apparatus according to claim 5, wherein the conversion circuit comprises a transformer circuit and a secondary-side circuit, the transformer circuit is configured to receive the primary-side output passing through the bulk capacitor and convert the primary-side output into a converted output, the secondary-side circuit receives the converted output and outputs the secondary-side output, and the transformer circuit is a resonant circuit.

7. The power conversion apparatus according to claim 1, wherein the primary-side circuit comprises a rectification circuit and a power factor correction circuit, the rectification circuit is configured to rectify the AC power to output a rectified electric power, and the power factor correction circuit boosts the rectified electric power and outputs the primary-side output.

8. The power conversion apparatus according to claim 7, wherein the conversion circuit comprises a transformer circuit and a secondary-side circuit, the transformer circuit is configured to receive the primary-side output passing through the bulk capacitor and convert the primary-side output into a converted output, the secondary-side circuit receives the converted output and outputs the secondary-side output, and the transformer circuit is a flyback circuit or a forward circuit.

9. The power conversion apparatus according to claim 1, wherein the threshold is a voltage threshold, the master control circuit outputs the abnormal signal when the obtained capacitor voltage at the end of the time interval is less than the voltage threshold, and the master control circuit does not output the abnormal signal when the obtained capacitor voltage at the end of the time interval is not less than the voltage threshold.

10. The power conversion apparatus according to claim 1, wherein the threshold is a power threshold, the master control circuit outputs the abnormal signal when the power is less than the power threshold, and the master control circuit does not output the abnormal signal when the obtained power is not less than the power threshold.

11. The power conversion apparatus according to claim 1, wherein the threshold is a time threshold, the master control circuit obtains the time interval when the two capacitor voltages are substantially equal to a first voltage value and a second voltage value, respectively, the master control circuit outputs the abnormal signal when the time interval is less than the time threshold, and the master control circuit does not output the abnormal signal when the time interval is not less than the time threshold.

12. A power conversion apparatus, comprising:
a primary-side circuit, having two output ends, wherein the primary-side circuit is adapted to rectify and boost an AC power and output a primary-side output from the two output ends;
a bulk capacitor, connected in parallel to the two output ends;
a conversion circuit, configured to receive the primary-side output passing through the bulk capacitor and convert the primary-side output into a secondary-side output; and
a master control circuit, configured to detect an electric power state of the AC power, and obtain a power of the secondary-side output within a time interval after the electric power state is power-off, wherein the master control circuit outputs an abnormal signal when the obtained power is less than a power threshold;
wherein the master control circuit comprises a primary control circuit and a secondary control circuit, the primary control circuit detects the electric power state and notifies the secondary control circuit when the electric power state is power-off, the secondary control circuit obtains the power of the secondary-side output within the time interval after receiving the power-off notification, and the secondary control circuit outputs the abnormal signal when the obtained power is less than the power threshold.

13. The power conversion apparatus according to claim 12, further comprising an isolation circuit, connecting the primary control circuit and the secondary control circuit.

14. The power conversion apparatus according to claim 13, wherein the primary-side circuit comprises a rectification circuit and a power factor correction circuit, the rectification circuit is configured to output a rectified electric power after rectifying the AC power, the power factor correction circuit boosts the rectified electric power and outputs the primary-side output.

* * * * *